(12) United States Patent
Agata et al.

(10) Patent No.: US 8,208,318 B2
(45) Date of Patent: Jun. 26, 2012

(54) SEMICONDUCTOR INTEGRATED CIRCUIT

(75) Inventors: Yasuhiro Agata, Osaka (JP); Noriaki Narumi, Osaka (JP); Yoshinobu Yamagami, Osaka (JP); Akira Masuo, Hyogo (JP)

(73) Assignee: Panasonic Corporation, Osaka (JP)

( * ) Notice: Subject to any disclaimer, the term of this patent is extended or adjusted under 35 U.S.C. 154(b) by 298 days.

(21) Appl. No.: 12/672,265

(22) PCT Filed: Sep. 11, 2009

(86) PCT No.: PCT/JP2009/004539
§ 371 (c)(1),
(2), (4) Date: Feb. 4, 2010

(87) PCT Pub. No.: WO2010/092636
PCT Pub. Date: Aug. 19, 2010

(65) Prior Publication Data
US 2011/0205827 A1    Aug. 25, 2011

(30) Foreign Application Priority Data
Feb. 16, 2009  (JP) .................... 2009-032644

(51) Int. Cl.
*G11C 5/14* (2006.01)
(52) U.S. Cl. ......... 365/189.09; 365/189.08; 365/210.12; 365/212
(58) Field of Classification Search ............. 365/189.09, 365/226, 189.08, 210.12, 212
See application file for complete search history.

(56) References Cited

U.S. PATENT DOCUMENTS

| 2002/0159289 A1 | 10/2002 | Senda et al. |
| 2004/0093456 A1 | 5/2004 | Terada et al. |
| 2008/0137465 A1* | 6/2008 | Katayama ............ 365/226 |
| 2008/0291750 A1 | 11/2008 | Takahashi et al. |

FOREIGN PATENT DOCUMENTS

| JP | 2001-332692 | 11/2001 |
| JP | 2002-324393 | 11/2002 |
| JP | 2004-158752 | 6/2004 |
| JP | 2005-235254 | 9/2005 |
| JP | 2009-009680 | 1/2009 |

OTHER PUBLICATIONS

Y.H. Chen et al., A 0.6V 45nm Adaptive Dual-rail SRAM Compiler Circuit Design for Lower VDD_min VLSIs, 2008 Symposium on VLSI Circuits Digest of Technical Papers, IEEE, pp. 210-211.

* cited by examiner

*Primary Examiner* — Thong Q Le
(74) *Attorney, Agent, or Firm* — McDermott Will & Emery LLP

(57) ABSTRACT

A system LSI (100) having a logic circuit (104) and a plurality of SRAM macros (103) includes a power supply circuit (102) configured to receive a voltage (VDDP) supplied from the outside of the system LSI (100), and to generate a stabilized voltage (VDDM) lower than the voltage (VDDP). An SRAM memory cell (103*a*) of each of the plurality of SRAM macros (103) is supplied with the voltage (VDDM) generated by the power supply circuit (102), and an SRAM logic circuit (103*b*) of each of the plurality of SRAM macros (103) is supplied with a voltage (VDD) supplied from the outside. In addition, the logic circuit (104) is supplied with the voltage (VDD) from the outside.

17 Claims, 6 Drawing Sheets

SEMICONDUCTOR INTEGRATED CIRCUIT

RELATED APPLICATIONS

This application is the U.S. National Phase under 35 U.S.C. §371 of International Application No. PCT/JP2009/004539, filed on Sep. 11, 2009, which in turn claims the benefit of Japanese Application No. 2009-032644, filed on Feb. 16, 2009, the disclosures of which Applications are incorporated by reference herein.

TECHNICAL FIELD

The present disclosure relates to semiconductor integrated circuits having a plurality of SRAM (Static Random Access Memory) macros.

BACKGROUND ART

In recent years, with reduction in feature sizes of semiconductor processes, there has been a trend toward further increase of the number of SRAM macros embedded in a system LSI (Large Scale Integration circuit). However, due to reduction in feature sizes of SRAMs, effect of a variation in threshold voltages (Vt) of SRAM memory cell transistors increases, thereby causing a problem in that malfunction of SRAMs occur at a voltage less than or equal to about 1 V. Therefore, for system LSIs in 45-nm and 32-nm generations or later, it is suggested to use a stabilized voltage of 1.2 V as the supply voltage for SRAM memory cells, utilizing power supply circuits, thereby to ensure operating margins of SRAMs.

In Non-Patent Document 1, a power supply CVDD generates a generated voltage stabilized at 1.2 V using a voltage regulator, is used as the power supply for an SRAM memory cell. Typically, normal operation is guaranteed for a logic circuit while the supply voltage falls within a voltage range of 1.2 V±about 10%, i.e., within a range from 1.08 V to 1.32 V. Thus, as with the configuration described in the above document, a logic circuit can operate also at a higher voltage than 1.08 V by using a stabilized voltage of 1.2 V generated within an LSI, thereby ensuring an operating margin even in an SRAM with a reduced feature size.

CITATION LIST

Non-Patent Document

NON-PATENT DOCUMENT 1: Y. H. Chen, et al., VLSI symposium 2008/Paper 21.3

SUMMARY OF THE INVENTION

Technical Problem

In recent years, since the number of SRAM macros which are embedded in a system LSI reaches several hundreds up to one thousand, if a power supply circuit is provided for each SRAM macro within a system LSI, and an SRAM memory cell voltage is generated, then a large number of power supply circuits will be required, thereby introducing area overhead in the system LSI. Also, since the activation rate of an SRAM macro varies depending on the system operation, each SRAM macro does not always operate.

In view of the foregoing, it is an object of the present invention to reduce the circuit area of a semiconductor integrated circuit having a plurality of SRAM macros supplied with supply voltages.

Solution to the Problem

In order to solve this problem, the first embodiment of the present invention is characterized by a semiconductor integrated circuit having a plurality of SRAM macros, each provided with an SRAM memory cell and an SRAM logic circuit, and a logic circuit, includes a power supply circuit configured to receive a first supply voltage supplied from the outside of the semiconductor integrated circuit, and to generate a generated voltage lower than the first supply voltage, where the logic circuit is supplied with a second supply voltage, which is lower than the first supply voltage, from the outside of the semiconductor integrated circuit; the SRAM memory cell of each of the plurality of SRAM macros is supplied with the generated voltage generated by the power supply circuit; and the SRAM logic circuit of each of the plurality of SRAM macros is supplied with the second supply voltage.

According to the first embodiment, since a generated voltage generated by a common power supply circuit is supplied to a plurality of SRAM macros, there is no need to provide a power supply circuit for each of the SRAM macros. Thus, as compared to when a power supply circuit is provided for each of the SRAM macros, the circuit area of a semiconductor integrated circuit incorporating power supply circuits can be reduced.

The second embodiment of the present invention is characterized by a semiconductor integrated circuit having a plurality of SRAM macros, provided with an SRAM memory cell and an SRAM logic circuit, and a logic circuit, where each of the SRAM memory cells of the plurality of SRAM macros is supplied with a first supply voltage from the outside of the semiconductor integrated circuit, and each of the SRAM logic circuits of the plurality of SRAM macros is supplied with a second supply voltage, which is lower than the first supply voltage, from the outside of the semiconductor integrated circuit; and the logic circuit is supplied with the second supply voltage from the outside of the semiconductor integrated circuit.

According to the second embodiment, since SRAM macros are supplied with the first supply voltage and the second supply voltage both from the outside of a semiconductor integrated circuit, there is no need to provide a power supply circuit in the semiconductor integrated circuit, thus the circuit area of a semiconductor integrated circuit can be reduced.

Advantages of the Invention

According to the first embodiment, since a plurality of SRAM macros are supplied with a generated voltage generated by a common power supply circuit, there is no need to provide a power supply circuit for each of the SRAM macros. Thus, as compared to when a power supply circuit is provided for each of the SRAM macros, the circuit area of a semiconductor integrated circuit incorporating power supply circuits can be reduced.

According to the second embodiment, since SRAM macros are supplied with the first supply voltage and the second supply voltage both from the outside of a semiconductor integrated circuit, there is no need to provide a power supply circuit in the semiconductor integrated circuit, thus the circuit area of a semiconductor integrated circuit can be reduced.

DESCRIPTION OF EMBODIMENTS

Example embodiments of the present invention will be described below with reference to the drawings.

First Embodiment

Figure 1:
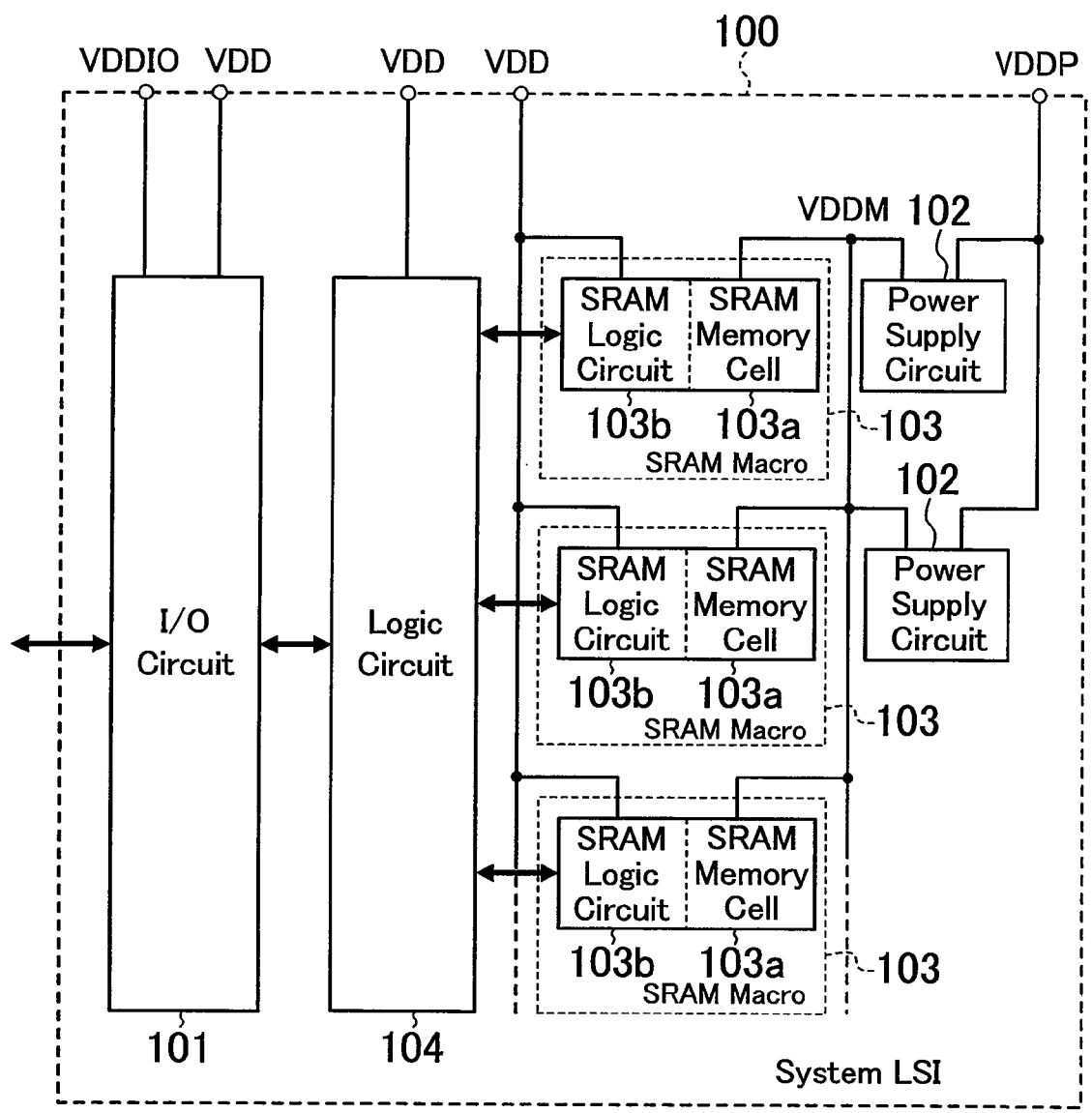
FIG. 1 is a block diagram illustrating a configuration of a system LSI 100 in accordance with the first embodiment.

FIG. 1 illustrates a configuration of a system LSI (semiconductor integrated circuit) 100 in accordance with the first embodiment. The system LSI 100 includes an I/O circuit 101, a plurality of power supply circuits 102, a multitude of SRAM macros 103, and a logic circuit 104. The system LSI 100 is encapsulated within a package.

The I/O circuit 101 is an external interface section between the system LSI 100 and the outside thereof, and the external interface section is supplied with a voltage VDDIO (e.g., 3.3 V) and a signal voltage VDD (e.g., 1.1 V) (a second supply voltage) for use in the system LSI 100.

The power supply circuits 102 each receives a voltage VDDP (a first supply voltage) supplied from the outside of the system LSI 100, and each generates a stabilized voltage VDDM (1.2 V) (a generated voltage) lower than the voltage VDDP. The power supply circuits 102 are supplied with the voltage VDDP from a same power supply line.

The SRAM macros 103 each includes therein an SRAM memory cell 103a and an SRAM logic circuit 103b, and mainly provides data communication with the logic circuit 104.

The SRAM memory cells 103a are supplied with the voltage VDDM generated by the power supply circuits 102.

The SRAM logic circuits 103b are supplied with the signal voltage VDD lower than the voltage VDDP from the outside of the system LSI 100.

The logic circuit 104 performs the functions of the system LSI 100, and the logic circuit 104 is supplied with the voltage VDD from the outside of the system LSI 100.

Figure 2:
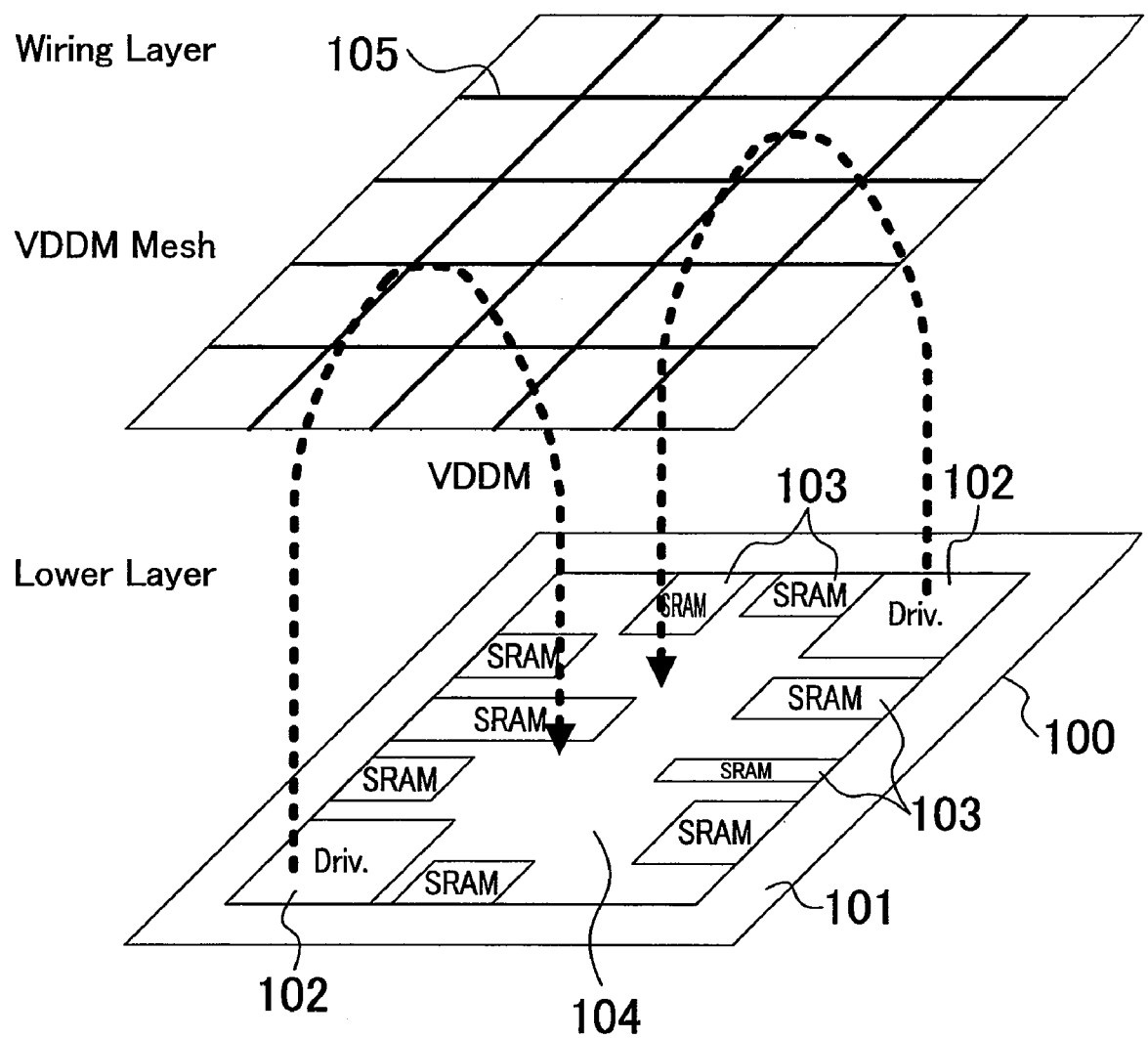
FIG. 2 is an illustrative diagram illustrating a configuration of a system LSI 100 in accordance with the first embodiment.

The SRAM macros 103 are disposed in a distributed manner at various locations on the system LSI 100. As shown in FIG. 2, many SRAM macros 103 are disposed on a lower layer of the system LSI 100, while VDDM power supply lines 105 of a mesh configuration formed in a multi-layer structure are arranged on a wiring layer of the system LSI 100. The power supply lines 105 are metal lines. In addition, the power supply circuits 102 are mounted in a plurality of locations, spaced apart from each other, on the system LSI 100.

Figure 3:
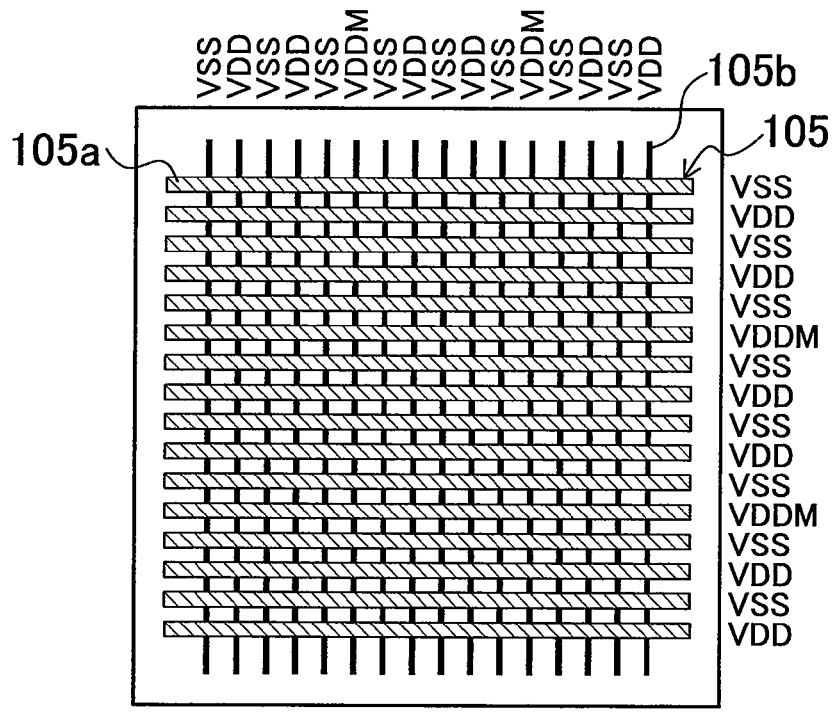
FIG. 3 is an illustrative diagram illustrating a detailed configuration of power supply lines 105 in accordance with the first embodiment.

As shown in FIG. 3, the power supply lines 105 are configured in a mesh configuration using two layers of a first wiring layer 105a and a second wiring layer 105b. As the wiring configuration of the power supply lines 105 is preferred to be a wiring configuration in which the lines of the voltage VDD or the voltage VDDM and the lines of a voltage VSS, which is a ground voltage, are arranged alternately. In addition, it is preferred that the sum of the line widths of the lines supplying the voltage VDD and the lines supplying the voltage VDDM be substantially equal to the sum of the line widths of the lines supplying the voltage VSS, which is the ground voltage. In the wiring configuration of FIG. 3, currents flow from the lines of both the voltage VDD and the voltage VDDM into the lines of the voltage VSS. Therefore, when wiring is performed, the lines of the voltage VDD and the lines of the voltage VSS, which is the ground voltage, are arranged alternately first, then current consumed in the lines of the voltage VDDM is estimated based on the mounted SRAM macros 103, and lastly a necessary number of the lines of the voltage VDD are replaced with the lines of the voltage VDDM. With such wiring, the area efficiency of the power supply lines 105 is improved as compared to when the lines of the voltage VDDM are arranged separately from the lines of the voltage VDD. In addition, since a line of the voltage VDDM is sandwiched by lines of the voltage VSS, power supply noise from a line of the voltage VDD to a line of the voltage VDDM is blocked, and thus the effect of power supply noise is reduced.

Figure 4:
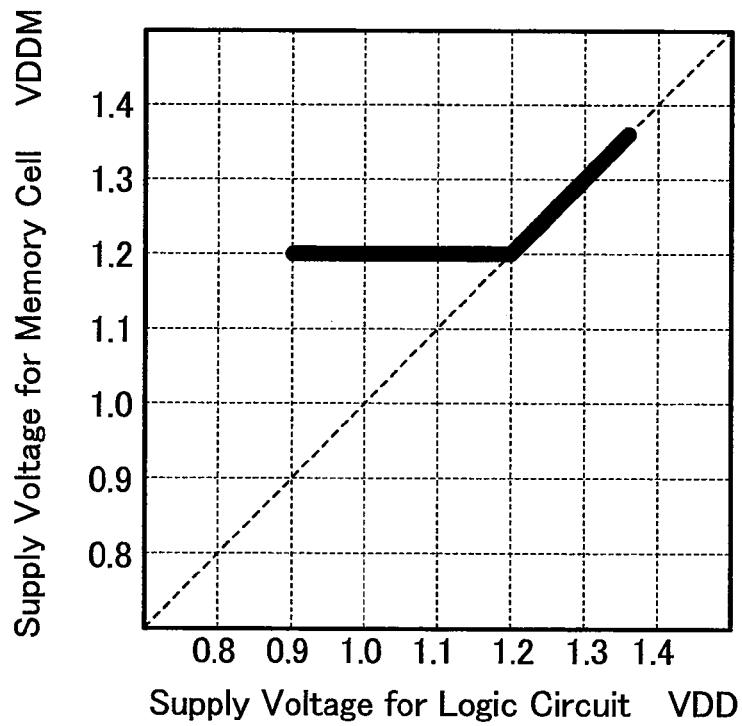
FIG. 4 is a graph showing a preferred relationship between a voltage VDD of a logic circuit 104 and a voltage VDDM of an SRAM memory cell 103a in accordance with the first embodiment.

FIG. 4 shows a preferred relationship between the voltage VDD of the logic circuit 104 and the voltage VDDM of the SRAM memory cells 103a. The voltage VDDM is required to be a stabilized voltage of 1.2 V when the voltage VDD falls within a range for normal operation (1.1 V±0.1 V). However, during an inspection of the system LSI 100, etc., an operation test is performed at a voltage higher than 1.2 V. In these situations, if a relationship exists where the voltage VDD>the voltage VDDM, a bi-directional level shifter circuit will be required in a voltage conversion section within each of the SRAM macros 103, thereby causing an area increase of the SRAM macros 103. If there is a relationship where the voltage VDDM≧the voltage VDD, the voltage conversion section can be implemented by a simple level shifter, and an area increase of the system LSI 100 can be avoided. Thus, it is desirable that the relationship between the voltage VDD and the voltage VDDM be such that the voltage VDDM≧the voltage VDD as shown in FIG. 4, that is, the voltage VDD be not higher than the voltage VDDM.

The voltage VDDP is set, for example, at an intermediate voltage between the voltage VDDIO and the voltage VDDM, or at an intermediate voltage between the voltage VDDIO and the voltage VDD, that is, at a voltage higher than the voltage VDD and lower than the voltage VDDIO. For example, if the voltage VDDM of 1.2 V is generated from the voltage VDDP=the voltage VDDIO of 3.3 V, then power, which is obtained by multiplication of 2.1 V (=3.3 V−1.2 V) by current consumption with respect to the voltage VDDM, is consumed in the power supply circuits 102. Meanwhile, if the voltage VDDM of 1.2 V is generated from the voltage VDDP, for example, of 1.5 V, then only the power, which is obtained by multiplication of 0.3 V (=1.5 V−1.2 V) by current consumption with respect to the voltage VDDM, is consumed in the power supply circuits 102, thereby reducing the current consumption to one-seventh.

If a power supply circuit 102 is provided for each of the SRAM macros 103, since all the SRAM macros 103 on the system LSI 100 are not always active, the number of power supply circuits 102 will be excessive. In addition, while each of the power supply circuits 102 usually includes a voltage detection circuit section and a voltage output circuit section, one voltage detection circuit section is sufficient for all the SRAM macros 130. From these viewpoints, if a power supply circuit 102 is provided for each of the SRAM macros 103, the area of the system LSI 100 will be larger than necessary.

In this embodiment, the voltage VDDM necessary for all the SRAM macros 103 is generated by a smaller number of power supply circuits 102 than that of the SRAM macros 103, and is supplied to the SRAM macros 103 by the VDDM power supply lines 105 of a mesh configuration. Therefore, the area efficiency of the system LSI 100 is improved as compared to when a power supply circuit 102 is provided for each of the SRAM macros 103.

In addition, since the power supply circuits 102 are mounted in a plurality of locations spaced apart from each other on the system LSI 100, a power drop in the power supply lines 105 is prevented. Therefore, mount capacity of the SRAM macros 103 can be increased without compromising the functions of the system LSI 100.

Moreover, in an SRAM memory cell 103a in the 45-nm process technology generation or later, since variation in threshold voltages of MOS transistors is large, there may be cases where data is corrupted and lost at lower voltages. For example, when operation is guaranteed in a voltage range of VDD=1.1 V±0.1 V, since operation needs to be guaranteed even at the lower limit voltage of 1.0 V, the operating margin of an SRAM memory cell 103a is inadequate. Thus, by supplying the stabilized voltage VDDM (1.2 V) to the power supplies of the SRAM memory cells 103a using the power supply circuits 102, a stabilized operating margin of an SRAM memory cell 103a can be ensured regardless of voltage range in which operation of the system LSI 100 is guaranteed.

Furthermore, a difference between a signal voltage of the logic circuit 104 and a signal voltage of the SRAM logic circuit 103b of an SRAM macro 103 causes a malfunction during data communication between the logic circuit 104 and the SRAM macro 103, but in this embodiment, the SRAM logic circuit 103b is supplied with the voltage VDD. Therefore, malfunction during data communication between the logic circuit 104 and an SRAM macro 103 is prevented.

Second Embodiment

Figure 5:
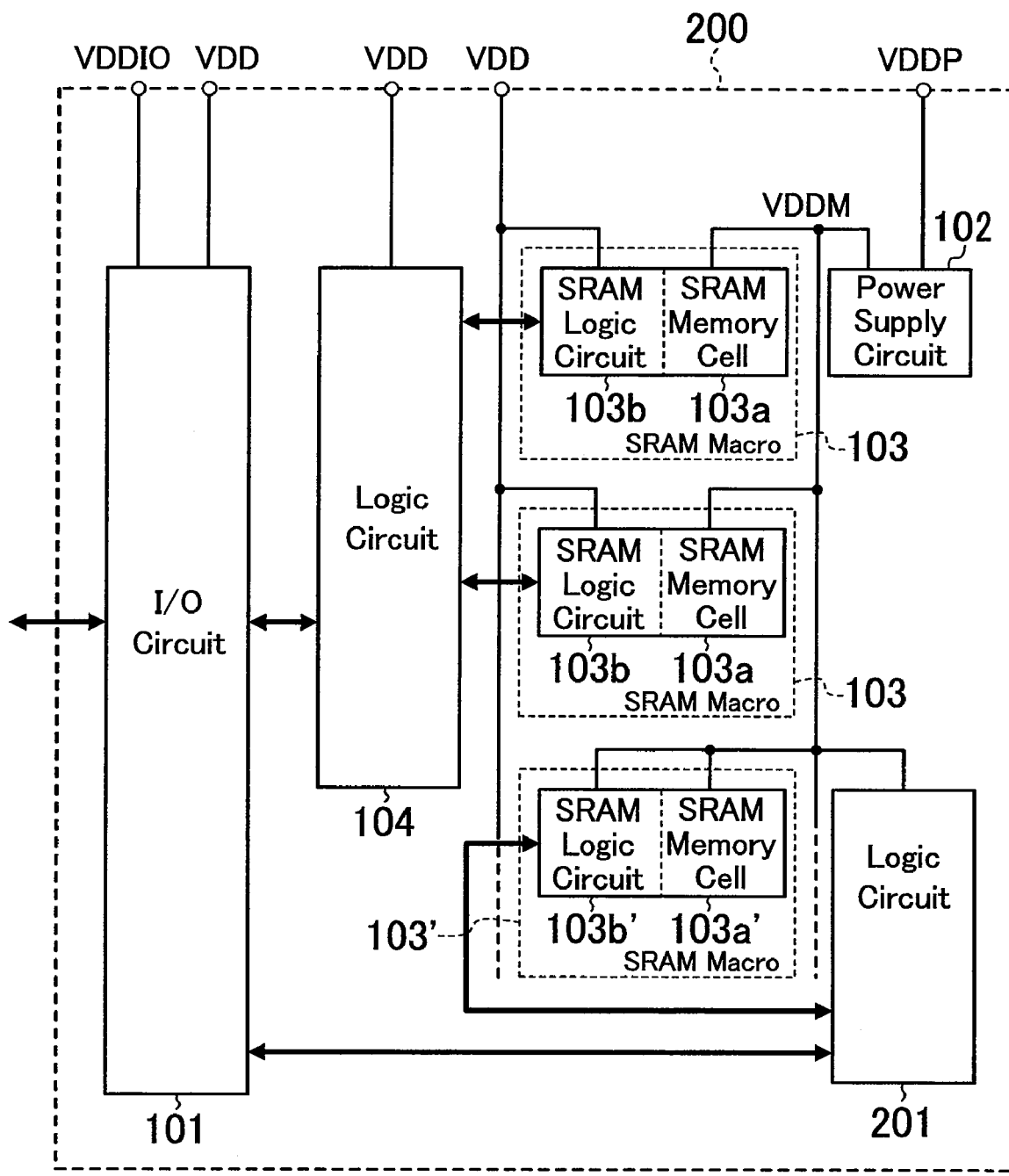
FIG. 5 is a block diagram illustrating a configuration of a system LSI 200 in accordance with the second embodiment.

FIG. 5 illustrates a system LSI 200 in accordance with the second embodiment. In the second embodiment, the system LSI 200 is provided with, in addition to the components of the system LSI 100 of the first embodiment, a logic circuit 201 capable of high-speed operation using the stabilized voltage VDDM generated by the power supply circuit 102. In addition, the SRAM logic circuit 103b' of an SRAM macro 103' (a second SRAM macro) which communicates with the logic circuit 201 is supplied with the stabilized voltage VDDM generated by the power supply circuit 102, instead of the voltage VDD. Note that the number of SRAM macros 103' whose SRAM logic circuit 103b' is supplied with the voltage VDDM may be one or more. Since the other part of the configuration is same as that of the first embodiment, identical or equivalent component parts are indicated by like reference characters, and the explanation thereof will be omitted.

Normally, the supply voltage VDD for the logic circuit 104 is, for example, 1.1 V±0.1 V, and operation speed of the logic circuit 104 depends on the lower limit voltage of 1.0 V. In this embodiment, since the stabilized voltage VDDM of 1.2 V generated by the power supply circuit 102 is used as the supply voltage for the logic circuit 201, operation speed of the logic circuit 201 depends on the voltage VDDM of 1.2 V, which is higher than the voltage VDD, thereby achieving high-speed operation of the logic circuit 201. Thus, the performance of the system LSI 200 improves.

Third Embodiment

Figure 6:
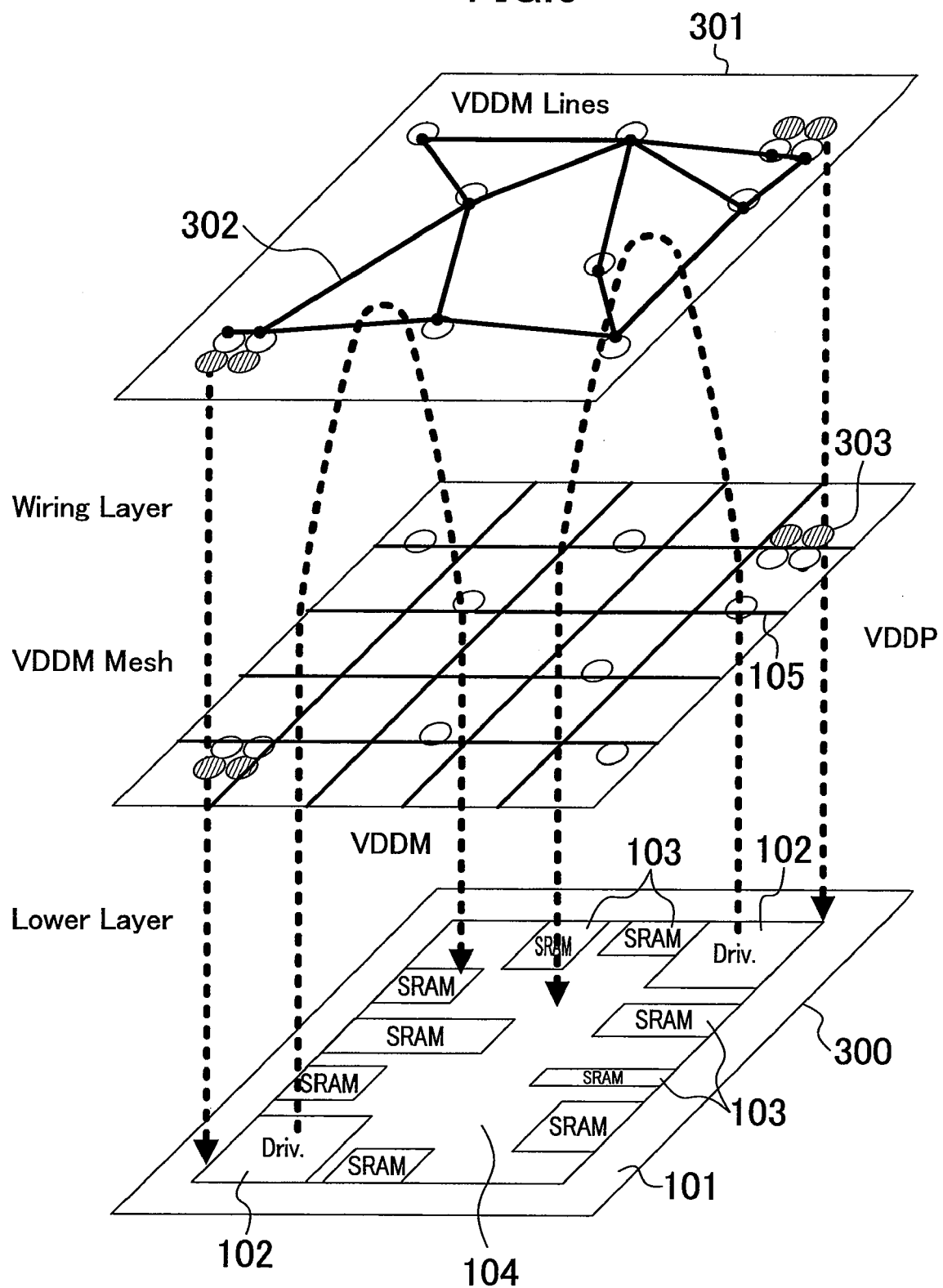
FIG. 6 is an illustrative diagram illustrating a configuration of a system LSI 300 and a package in accordance with the third embodiment.

FIG. 6 illustrates a system LSI 300 in accordance with the third embodiment. In the third embodiment, lines 302 are provided on a substrate 301 formed on the system LSI 300 within a package. In addition, at a plurality of locations on the system LSI 300, area pads 303 connected to the VDDM power supply lines 105 of a mesh configuration are formed, and the area pads 303 are connected to the lines 302 through solder bumps. Moreover, the voltage VDDM generated by the power supply circuit 102 is supplied to the SRAM macros 103 through the area pads 303 and the lines 302 within the package. Since the other part of the configuration is same as that of the first embodiment, identical or equivalent component parts are indicated by like reference characters, and the explanation thereof will be omitted. Note that the features of this embodiment may be applied to the system LSI 200 of the second embodiment.

In a typical case where a sheet resistance of the lines 302 within the package is one tenth to one hundredth of a sheet resistance of the power supply lines of the system LSI 300, since, in this embodiment, the voltage VDDM is supplied to the VDDM power supply lines 105 of the system LSI 300 through the lines 302, a power drop in the system LSI 300 is more effectively prevented.

Fourth Embodiment

Figure 7:
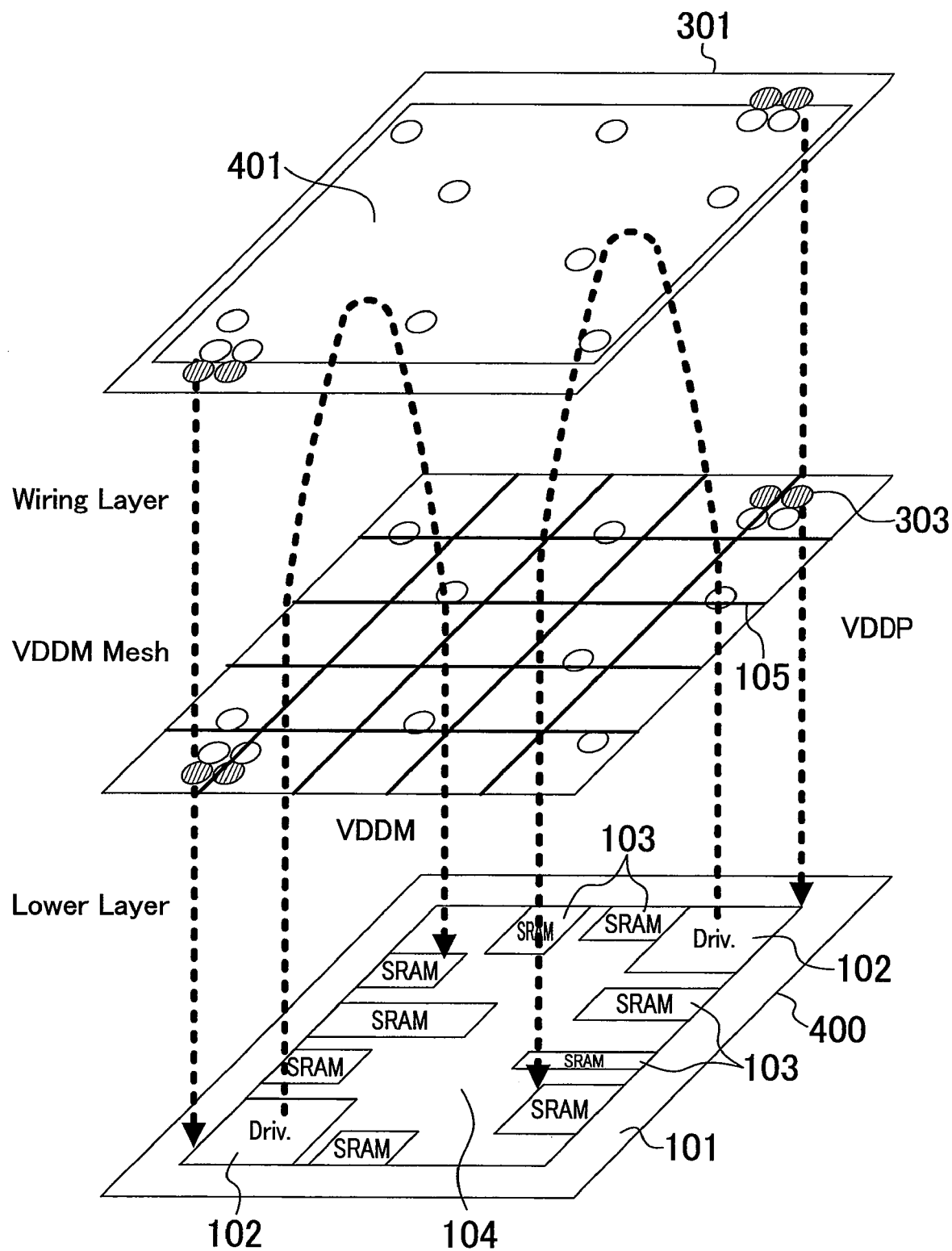
FIG. 7 is an illustrative diagram illustrating a configuration of a system LSI 400 and a package in accordance with the fourth embodiment.

FIG. 7 illustrates a system LSI 400 in accordance with the fourth embodiment. In the fourth embodiment, a conductor surface 401 is provided within a package instead of the lines 302, and the voltage VDDM generated by the power supply circuit 102 is supplied to the SRAM macros 103 through the area pads 303 and the conductor surface 401 within the package. Since the other part of the configuration is same as that of the first embodiment, identical or equivalent component parts are indicated by like reference characters, and the explanation thereof will be omitted. Note that the features of this embodiment may be applied to the system LSI 200 of the second embodiment.

In this embodiment, since utilization of the conductor surface 401 enables the resistance to be reduced as compared to when the lines 302 are used, a power drop in the system LSI 400 can be more effectively prevented.

Note that, in the above embodiments 1-4, the voltage VDDP may be substantially equal to the voltage VDDIO, and may be generated by a same power supply which generates the voltage VDDIO supplied to the I/O circuit 101. In this case, since there is no need to provide the system LSIs 100, 200, 300, and 400 each with an independent terminal for the voltage VDDP, the number of terminals can be reduced, and the areas of the system LSIs 100, 200, 300, and 400 can be reduced as well.

In addition, in the above embodiments 1-4, the voltage VDDM may be directly supplied, as the second supply voltage, from the outside of the system LSIs 100, 200, 300, and 400. That is, depending on the needs for higher performance of the logic circuit 104, etc., a power supply generating a voltage of 1.2 V with a small variation may be each provided outside the system LSIs 100, 200, 300, and 400, and the voltage VDDM may be supplied to a plurality of SRAM macros 103 directly from this power supply. Although a power supply generating a stabilized voltage with a small variation is generally high-priced, since there is no need to provide a power supply circuit within each of the system LSIs 100, 200, 300, and 400, the areas of the system LSIs 100, 200, 300, and 400 can be reduced.

Moreover, in the above embodiments 1-4, the system LSIs 100, 200, 300, and 400 may each have a mode in which output is placed in a high impedance (Hi-Z) state by the power supply circuits 102. In this mode, an alternative voltage to the voltage VDDM (generated voltage) can be applied to a plurality of SRAM macros 103 directly from the outside of the system LSIs 100, 200, 300, and 400. When the system LSIs 100, 200, 300, and 400 are inspected, an overvoltage exceeding a normal voltage needs to be applied to the transistors, but while the outputs of the power supply circuits 102 are in activated states, since the power supply circuits 102 output 1.2 V regardless of the external voltage, an overvoltage is not applied to the SRAM memory cells 103a, so inspections can not be performed. However, by designing the power supply circuits 102 to place each output thereof in a Hi-Z state, the voltage VDDM can be applied directly from the outside.

INDUSTRIAL APPLICABILITY

A semiconductor integrated circuit in accordance with the present invention has an advantage of reducing the circuit area of a semiconductor integrated circuit having power supply circuits, and is useful as, for example, a semiconductor integrated circuit having a plurality of SRAM (Static Random Access Memory) macros.

DESCRIPTION OF REFERENCE CHARACTERS

100 System LSI (Semiconductor Integrated Circuit)
101 I/O Circuit
102 Power Supply Circuit
103 SRAM Macro
103a SRAM Memory Cell
103b SRAM Logic Circuit
104 Logic Circuit
105 Power Supply Line
200 System LSI (Semiconductor Integrated Circuit)
201 Logic Circuit
300 System LSI (Semiconductor Integrated Circuit)
301 Substrate
302 Line
303 Area Pad
400 System LSI (Semiconductor Integrated Circuit)
401 Conductor Surface

The invention claimed is:

1. A semiconductor integrated circuit, comprising:
a plurality of SRAM macros, each including an SRAM memory cell and an SRAM logic circuit;
a logic circuit; and
a power supply circuit configured to receive a first supply voltage supplied from the outside of the semiconductor integrated circuit, and to generate a generated voltage lower than the first supply voltage, wherein:
the logic circuit is supplied with a second supply voltage, which is lower than the first supply voltage, from the outside of the semiconductor integrated circuit, and
the SRAM memory cell of each of the plurality of SRAM macros is supplied with the generated voltage generated by the power supply circuit, and at least one SRAM logic circuit is supplied with the second supply voltage.

2. The semiconductor integrated circuit of claim 1, wherein at least one SRAM logic circuit of the plurality of SRAM macros is supplied with the generated voltage instead of the second supply voltage.

3. The semiconductor integrated circuit of claim 1, wherein the generated voltage is supplied to the plurality of SRAM macros through a connection path network outside the semiconductor integrated circuit.

4. The semiconductor integrated circuit of claim 3, wherein the connection path network includes lines within a package which encapsulates the semiconductor integrated circuit.

5. The semiconductor integrated circuit of claim 3, wherein the connection path network includes a conductor surface within a package which encapsulates the semiconductor integrated circuit.

6. The semiconductor integrated circuit of claim 1, comprising:
metal lines, which supply the generated voltage, configured in a mesh configuration.

7. The semiconductor integrated circuit of claim 6, wherein lines supplying the second supply voltage and the generated voltage and lines supplying a ground voltage are arranged in a mesh configuration within the semiconductor integrated circuit, and
the sum of the line widths of the lines supplying the second supply voltage and the lines supplying the generated voltage is substantially equal to the sum of the line widths of the lines supplying the ground voltage.

8. The semiconductor integrated circuit of claim 1, wherein the generated voltage is greater than or equal to the second supply voltage.

9. The semiconductor integrated circuit of claim 1, wherein the semiconductor integrated circuit includes multiple ones of the power supply circuit, and the multiple ones of the power supply circuit are supplied with the first supply voltage from a same power supply line.

10. The semiconductor integrated circuit of claim 1, further comprising:
an I/O circuit supplied with a third supply voltage, wherein
the first supply voltage is substantially equal to the third supply voltage.

11. The semiconductor integrated circuit of claim 1, further comprising:
an I/O circuit supplied with a third supply voltage, wherein
the first supply voltage is higher than the second supply voltage and lower than the third supply voltage.

12. The semiconductor integrated circuit of claim 1, wherein
the semiconductor integrated circuit is configured to operate in a mode in which the power supply circuit places the output thereof in a high impedance (Hi-Z) state.

13. The semiconductor integrated circuit of claim 12, wherein
in the mode in which the power supply circuit places the output thereof in a high impedance (Hi-Z) state, the semiconductor integrated circuit is configured to be applied with an alternative voltage to the generated voltage to the plurality of SRAM macros from the outside of the semiconductor integrated circuit.

14. The semiconductor integrated circuit of claim 1, wherein the semiconductor integrated circuit is configured to receive a ground voltage.

15. The semiconductor integrated circuit of claim 1, wherein the second supply voltage is supplied from the outside of the semiconductor integrated circuit, but not from the power supply circuit.

16. A semiconductor integrated circuit, comprising:
a plurality of SRAM macros, each including an SRAM memory cell and an SRAM logic circuit; and
a logic circuit, wherein:
each of the SRAM memory cells of the plurality of SRAM macros is supplied with a first supply voltage from the outside of the semiconductor integrated circuit,
each of the SRAM logic circuits of the plurality of SRAM macros is supplied with a second supply voltage, which is lower than the first supply voltage, from the outside of the semiconductor integrated circuit, and
the logic circuit is supplied with the second supply voltage from the outside of the semiconductor integrated circuit.

17. The semiconductor integrated circuit of claim 16, wherein the semiconductor integrated circuit is configured to receive a ground voltage.

* * * * *